United States Patent
Baum et al.

(10) Patent No.: US 7,029,724 B1
(45) Date of Patent: Apr. 18, 2006

(54) COMPOSITION AND METHOD FOR FORMING DOPED A-SITE DEFICIENT THIN-FILM MANGANATE LAYERS ON A SUBSTRATE

(75) Inventors: Thomas H. Baum, New Fairfield, CT (US); Galena Doubinina, Watertown, MA (US); Daniel Studebaker, Brookline, MA (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/620,162

(22) Filed: Jul. 20, 2000

Related U.S. Application Data

(62) Division of application No. 08/825,480, filed on Mar. 28, 1997, now Pat. No. 6,117,571.

(51) Int. Cl.
*C23C 16/40* (2006.01)
*C23C 16/448* (2006.01)
*B05D 3/02* (2006.01)

(52) U.S. Cl. .......... 427/255.32; 427/576; 427/128; 427/130; 427/255.31; 427/372.2; 427/901; 423/599

(58) Field of Classification Search .......... 427/569, 427/576, 128, 132, 248.1, 250, 255.19, 255.28, 427/255.31, 255.32, 130, 376.2, 372.2, 901; 428/697, 694 T, 692, 693; 252/62.51 R; 423/599; 360/326
See application file for complete search history.

(56) References Cited

U.S. PATENT DOCUMENTS

| | | | |
|---|---|---|---|
| 3,658,568 A * | 4/1972 | Donley ............ | 427/165 |
| 4,857,361 A * | 8/1989 | Bloss et al. ......... | 427/109 |
| 4,937,152 A | 6/1990 | Sato et al. .......... | 429/30 |
| 5,045,169 A | 9/1991 | Feduska et al. ...... | 204/258 |
| 5,049,458 A | 9/1991 | Sato et al. .......... | 429/32 |
| 5,204,314 A | 4/1993 | Kirlin et al. ........ | 505/1 |
| 5,225,561 A | 7/1993 | Kirlin et al. ........ | 546/256 |
| 5,234,722 A | 8/1993 | Ito et al. ........... | 427/453 |
| 5,411,814 A * | 5/1995 | Jin et al. ........... | 428/692 |

(Continued)

FOREIGN PATENT DOCUMENTS

JP 4175226 6/1992

OTHER PUBLICATIONS

"Plasma Enhanced Metalorganic Chemical Vapor Deposition of Conductive Oxide Electrodes for Ferroelectric BaTiO$_3$ Capacitors," J. Zhang, et al., Mater. Res. Soc. Symp. Proc. vol. 310, *Ferroelectric Thin Films III*, E.R. Myers et al., editors, 1993, pp. 249-254.

(Continued)

*Primary Examiner*—Timothy Meeks
*Assistant Examiner*—Wesley D. Markham
(74) *Attorney, Agent, or Firm*—Marianne Fuierer; Maggie Chappuis; Tristan A. Fuierer

(57) ABSTRACT

A method of forming an A site deficient thin film manganate material on a substrate from corresponding precursor(s), comprising liquid delivery and flash vaporization thereof to yield a precursor vapor, and transporting the precursor vapor to a chemical vapor deposition reactor for formation of an A site deficient manganate thin film on a substrate. The invention also contemplates a device comprising an A site deficient manganate thin film, wherein the manganate layer is formed on the substrate by such a process and is of the formula $La_xM_yMnO_3$, where M=Mg, Ca, Sr, or Ba, and $(x+y)<1.0$, and preferably from about 0.5 to about 0.99.

22 Claims, 12 Drawing Sheets

U.S. PATENT DOCUMENTS

| | | | |
|---|---|---|---|
| 5,418,081 A | | 5/1995 | Kawasaki et al. ............. 429/33 |
| 5,453,330 A | | 9/1995 | Kawasaki et al. ............. 429/30 |
| 5,461,308 A | * | 10/1995 | Jin et al. ................. 324/117 R |
| 5,487,356 A | * | 1/1996 | Li et al. ........................ 117/99 |
| 5,549,977 A | | 8/1996 | Jin et al. ..................... 428/692 |
| 5,563,331 A | * | 10/1996 | Von Helmolt et al. ...... 73/31.05 |
| 5,659,101 A | * | 8/1997 | Biagini et al. ............... 585/601 |
| 5,792,569 A | | 8/1998 | Sun et al. .................... 428/692 |
| 5,856,276 A | | 1/1999 | Koshy et al. ................ 505/239 |
| 6,010,969 A | * | 1/2000 | Vaartstra ...................... 438/758 |
| 6,060,420 A | * | 5/2000 | Munakata et al. ........... 502/302 |

OTHER PUBLICATIONS

"Metal Organic Chemical Vapor Deposition of LaSrCoO Electrodes for Ferroelectric Capacitors." J. Zhang, et al., presented at the 6th ISAF Meeting, Mar. 1994.

"Magnetoresistance in magnetic manganese oxide with intrinsic antiferromagnetic spin structure." K. Chahara, et al., Appl. Phys. Lett. 63, 1990-2 (1993).

"Giant negative magnetoresistance in perovskitelike $L_{2/3}Ba_{1/3}MnO_x$ ferromagnetic films." R. von Helmolt, et al., Phys. Rev. Lett. 71, 2331-3 (1993).

Magnetic-Field-Induced metal-insulator phenomena in Pr-1-xCaxMnO3 with controlled charge-ordering instability, Y. Tomioka, et al., Physical Review B. vol. 53, No.- 4, pp. 106-109, Jan. 1996.

"Anomoious Magnetotransport Properties of Pr1-x-CaxMnO3", Tomioka, et al., Journal of Physical Society of Japan, vol. 64, No. 10, pp. 3626-3630, Oct. 1995.

"A First Order Phase Transition Induced by a Magnetic Field", Kuwahara, et al., Science, vol. 270, pp. 961-963, Nov. 1995.

* cited by examiner

COMPOSITION AND METHOD FOR FORMING DOPED A-SITE DEFICIENT THIN-FILM MANGANATE LAYERS ON A SUBSTRATE

This is a division of U.S. application Ser. No. 08/825,480, filed on Mar. 28, 1997, now U.S. Pat. No. 6,117,571.

BACKGROUND OF THE INVENTION

1. Field of the Invention

This invention relates generally to a method and composition for forming doped A-site deficient manganate thin films on substrates, and more particularly to a method and composition for making thin film manganate layers via metalorganic chemical vapor deposition (MOCVD) using a liquid delivery technique for flash vaporization of the precursor chemistry.

2. Description of the Related Art

Current magnetic sensors and read/write heads are fabricated from permalloy and multilayer giant magnetoresistant (GMR) metal structures. Permalloy ($Ni_{0.80}Fe_{0.20}$) exhibits a 2% change in resistivity in small magnetic fields, while the GMR multilayer FeMn/Co/Cu/NiFe exhibits a 4% change in a 10–20 Oe field. The observations of large resistance changes in $La_xA_yMnO_3$ (A=Ca, Sr, Ba) crystals in the presence of magnetic fields has generated intense interest in using these materials as magnetic sensors. Thin films of these colossal magnetoresistant (CMR) oxides have exhibited resistivity changes of over 100,000% in magnetic fields of >1 Tesla. Since CMR materials display far larger magnetoresistive changes than GMR materials, they have the potential to greatly improve both the detection sensitivity and signal-to-noise ratios in a MR device. The most suitable material for commercial applications would have a large magnetoresistance change in a small magnetic field at ambient temperatures.

High quality, doped lanthanum manganate films possess numerous properties of technological importance, including temperature sensitive resistance changes, bolometers, substantial magneto-resistance changes under exposure to magnetic fields, and utility for device applications such as switches, sensors, thin-film recording heads and magnetic random access memories (MRAM). The doping of the $LaMnO_3$ system with Group II elements (i.e., Mg, Ca, Sr and Ba) is critical to providing robust materials with the desired electrical, magnetic and thermal responses. In this material system, precise and repeatable compositional control is required in order to produce films of high quality. Physical deposition methods (e.g., sputtering, evaporation) to fabricate thin film deposition are deficient in this regard, as are traditional approaches to metalorganic chemical vapor deposition (MOCVD) involving the use of bubblers.

A great need exists to miniaturize discrete magnetic components. At present, thin film-based devices are an attractive solution to many magnetic sensor and MRAM applications, but require cost-effective processing of films in the thickness range of from about 0.1 to about 10 microns, as well as room temperature electrical and magnetic responses, and large magnetoresistive responses to small magnetic fields.

A number of processes have been investigated to date for depositing manganate films, including pulsed laser ablation deposition (PLD), sputter deposition, and sol-gel processing (SGP). While high quality films have been produced in some cases, no technique has yet been demonstrated which has clear potential for commercially viable device manufacture.

The high rate deposition techniques, which have been used successfully for multicomponent oxide thin films are pulsed laser ablation deposition (PLD) and chemical vapor deposition (CVD). The use of PLD for Ca doped LaMnO3 (LCMO) has been investigated and the quality of films produced was acceptable. However, as the deposition area is scaled in PLD, one loses the inherent deposition rate advantage. Area scaling is important in making manganate layers because, although device and chip dimensions are small, cost-effective deposition in an integrated process is ideally accomplished at wafer scale dimensions. Further, magnetic sensors and random access memories require thin-film application over complex topographical features (i.e., in multilayered devices).

Another technique, termed sol gel processing (SGP), has been investigated by various researchers. This technique has the advantage of processing at lower temperatures, but unfortunately the resultant film properties have not been as good as desired. In particular, film defects are high and conformality is poor.

It would therefore be an advance in the art, and is accordingly an object of the invention, to provide a method for the formation of thin film A site deficient, doped manganate materials by MOCVD which affords repeatable and stringent stoichiometric control of the manganate film composition, and resulting thin-film properties. It is the stoichiometric composition and the method to deposit the same that constitutes this invention. In specific, A site deficient doped manganates exhibit room temperature electrical and magnetic transitions towards small magnetic fields.

Other objects and advantages of the invention will be more fully apparent from the ensuing disclosure and appended claims.

SUMMARY OF THE INVENTION

In accordance with the present invention, liquid delivery, chemical vapor deposition (CVD) is used to deposit doped manganate thin films. By such methodology, structure—property relationships may be examined, and the deposited film stoichiometry may be readily controlled by changing the precursor concentration in solution.

In the characterization of the liquid delivery, chemical vapor deposition method of the invention, the film Curie temperature was measured and found to be directly dependent on the film composition and stoichiometry. Manganese-rich, $La_xCa_yMnO_3$ films have been formed which exhibit Curie temperatures at or above room temperature and therefore are technologically valuable and a significant advance in the art.

Applications of the present invention include, but are not limited to, magnetic storage read-write heads, magnetic sensors, microelectromechanical sensors (MEMS), magnetic random access memories (MRAM), bolometers, thermal switches and thin sensing films associated with focal plane arrays, and a variety of other applications requiring electrical, thermal or magnetic sensing capabilities.

Historically, CMR manganates exhibit large MR responses at low temperatures in magnetic fields of $\geq 1$ Tesla. The MR response increases with increasing field strength up to 10 Tesla, the highest fields generally used for the measurements. The MR response, however, is strongly temperature dependent and reaches a maximum at a specific temperature known as the Curie temperature. At this temperature, the material changes from a ferromagnet to a paramagnet. In most Ca-doped manganates, the Curie temperature (Tc) is well below room temperature and therefore, severely limits the commercial viability of these materials. For example, the most widely studied system is $La_{0.66}Ca_{0.33}MnO_3$ with a measured Curie temperature of 251° K.

This invention relates to compositions, and a method for depositing same, that exhibit MR and Tc values at room temperature or above, and improving the MR response towards small magnetic fields. A common method to tune the magnetic response is to dope the manganate with a Group II cation in the A site, and to vary processing and post-deposition conditions. Recent reports indicate that the Curie temperature may be increased in off-stoichiometry $LaMnO_3$ films. For instance, a $La_{0.75}MnO_3$ film exhibited a Curie temperature of 240° K, in contrast to a $LaMnO_3$ film (1:1 stoichiometry) that displayed a Tc of 115 K.

In one aspect of the present invention, the liquid delivery metal organic chemical vapor deposition (MOCVD) of A site (A site=La+M) deficient (where M=Mg, Ca, Sr and Ba), c-axis oriented $La_xM_yMnO_3$ thin films is carried out on a suitable substrate such as $LaAlO_3$. MOCVD is advantageous for large-scale fabrication and silicon device integration. Moving the Curie temperature to room temperature (or above) facilitates widespread applicability ranging from thin-film sensors to thermal switches. In specific, A site deficient manganate films exhibit Curie temperatures above 290° K and display MR responses to relatively small magnetic fields; these combined properties are necessary for device applications. Room temperature, magnetoresistant responses between 1 and 7% are observed in fields of ≦700 Ørsted (Oe). The film stoichiometry—property relationships in MOCVD deposited A site deficient doped manganate thin films is described more fully hereinafter.

The as-deposited CVD films displayed transition temperatures (Tc) ranging from 150–294° K. It has previously been reported that annealing CMR films in oxygen increases the Tc. The increased transition temperature may result from improved crystal lattice ordering and/or adsorption of oxygen which alters the film stoichiometry. An increase in transition temperature is observed when the as-deposited CVD films are annealed to 1000° C. in oxygen for four hours. The change in transition temperature ($\Delta T_c$) observed after annealing ranged from 17° C. to 50° C. The as-deposited films, which exhibited high transition temperatures before annealing, display the smallest increase in $T_c$ upon annealing. Films which were annealed in argon exhibited a decrease in the $T_c$, corresponding to a loss of oxygen, and possibly a decrease in $Mn^{+4}$ ionic concentration.

X-ray diffraction measurements were made on as-deposited and thermally annealed films to determine if there was a significant change in crystal ordering after annealing. θ–2θ measurements showed that the intensity of the lanthanum calcium manganate (LCMO) peaks increased after annealing relative to the substrate peaks. The increased intensity is likely due to an increased crystallinity in this orientation. In most films, the position of the [200] peak also shifted to higher θ–2θ values corresponding to a shrinking of the c-axis. For films annealed in argon, the [200] peak shifted to lower 2θ values corresponding to an increase in the c-axis orientation. Since $Mn^{+4}$ has a smaller ionic radius than that of $Mn^{+3}$ these observations may be indicative of a gain (loss) of $Mn^{+4}$ ions upon oxygen (argon) annealing.

Solutions with differing metalorganic precursor concentrations were used to produce a series of films with varying film stoichiometries. The focus of the study was to vary the (La+a):Mn ratio and the La:Ca ratio with respect to the $L_{0.66}Ca_{0.33}MnO_3$ system, which has been the most widely studied form of this material. The $La_{0.66}Ca_{0.33}MnO_3$ stoichiometry is thought to afford the best CMR properties between the antiferromagnetic insulators $LaMnO_3$ and $CaMnO_3$. The doping of $Ca^{+2}$ ions into $La^{+3}$ (A) sites creates a charge imbalance which is offset by the creation of $Mn^{+4}$ sites. The mixture of $Mn^{+3}$ and $Mn^{+4}$ sites-creates charge carriers leading to electron exchange between $Mn^{+3}$ and $Mn^{+4}$ sites, a phenomenon known as double exchange.

The $Mn^{+3}:Mn^{+4}$ ratio is also heavily dependent upon the oxygen content of the sample. Although the LCMO general formula has three oxygen ions, the number of oxygen ions can easily change depending on the processing conditions. In order to minimize effects of such oxygen variation in empirical work relating to the present invention, and to maintain a constant oxygen content in films respective for purposes of comparison, processing conditions in respective experiments were held constant for all growths, and the films were annealed together, so that the $Mn^{+3}:Mn^{+4}$ ratio is predominantly affected by the La:Ca and (La+a):Mn ratios in these films.

The shift in the transition temperature for an A site deficient (La+Ca):Mn film of these empirical tests is exemplified by the data shown in FIG. 1. This same film was examined in high magnetic fields as shown in FIG. 2. The film had a (La+Ca):Mn ratio of 0.73 and a measured Tc of 317°-K after thermal annealing in oxygen. Similar results were obtained for films deposited under identical conditions, but with varying film stoichiometries. The films with a stoichiometry of $La_{0.66}Ca_{0.33}MnO_3$ exhibited a $T_c$ of 251 K, in agreement with the literature. However, when the (La+Ca):Mn ratio was reduced, the "as-deposited" films exhibited $T_c$ values as high as 295 K. These same films all exhibited increased $T_c$ values after thermal annealing in oxygen. These results point towards the possibility of a hole dependence in the conduction mechanism. If conduction were only dependent on the $Mn^{+3}/Mn^{+4}$ ratio, then higher $T_c$ values could have been achieved in the $La_{0.66}Ca_{0.33}MnO_3$ system, since the ratio can be varied by oxygen content, but this was not observed. Consistent with this hypothesis, other empirical work relating to the present invention demonstrates that the variance in (La+Ca):Mn ratio has a greater influence on the observed $T_c$ than does the La:Ca ratio.

The foregoing hypothesis of a hole-dependent conduction mechanism is understood as being illustratively proposed as a possible basis for the observed increase in $T_c$ values after thermal annealing in oxygen. Such hypothesis and mechanism therefore are not intended to be limiting on the character or scope of the present invention, and therefore should be non-limitingly construed in relation to the method and composition of the present invention as herein disclosed.

Magnetoresistance response to small magnetic fields measured on A deficient LCMO films representative of the invention demonstrate the effect of temperature. The MR response is defined as the percentage change in film resistivity both in and out of the magnetic field. FIG. 4 shows the MR response for an exemplary A site deficient film in a 470 Oe field applied perpendicularly to the film. The CVD film has a stoichiometry of $La_{0.49}Ca_{0.24}MnO_3$ and an MR ratio of 3.5% measured at 27° C. A strong temperature dependence to the measured MR response was observed. In the same film, MR responses were as high as 7% at 27° C. in a 700 Oe field as shown in FIG. 5. This MR response is the highest reported to date in small magnetic fields. A corresponding film which was Mn-deficient displayed no MR response in a 470 Oe field at room temperature.

In LCMO films formed in accordance with the present invention, Curie temperatures at or above room temperature were observed in the MOCVD deposited $La_xM_yMnO_3$ thin films. After annealing in oxygen, the Tc increases, the intensity of the [200] peak increases, and an MR response is observed at room temperature in small magnetic fields. These Curie temperatures and low field MR ratios in the (La+ Ca) deficient thin films of the present invention are the highest reported to date in LCMO films. Presently preferred films according to the invention include those with a (La+ Ca):Mn ratio between 0.6 and 0.9.

The foregoing results suggest that hole conduction is critical to both the electrical conduction and magnetic response observed in these films, and evidence the suitability of the liquid delivery MOCVD film growth process of the invention for sensor device fabrication and integrated thin film applications requiring large area doped manganate films.

The present invention includes a method of depositing A site deficient doped manganate thin films by metalorganic chemical vapor deposition (MOCVD) utilizing a liquid delivery technique. In comparison with previous deposition techniques, the invention affords precise compositional control by use of liquid precursor solutions which are flash vaporized. Flash vaporization has the added benefit of preventing unwanted premature decomposition of the precursor species; this is especially important for Group II metals (e.g., Mg, Ca, Sr, Ba). In addition, the invention utilizes tailored precursor chemistries that are compatible for forming the thin film material. Additionally, such precursor chemistries do not undergo ligand exchange (or alternatively have degenerate exchange mechanisms). As a result, the formation of involatile species is avoided. The control of solution concentrations of reactants is advantageously utilized to control the film stoichiometry of the product LCMO films and their electrical, magnetic and thermal properties. The method of the present invention provides the ability to shift the temperature of the transition from that of a metallic-like conductor to that of a semiconductor or insulating material, via film stoichiometry, and is a key feature of this invention. Concurrently, the magnetic properties may be shifted from ferromagnetic behavioral characteristics to paramagnetic behavioral characteristics in the same temperature regime. By controlling the temperature of this transition, room temperature magnetoresistance is achieved in the A site deficient doped manganate films.

In contrast to the prior art approaches, metalorganic chemical vapor deposition (MOCVD) offers a unique combination of attributes not found in other processes, including high deposition rates, excellent composition control, scalability to large areas, and conformality.

The present invention in one aspect relates to a method of forming a thin film magnetoresistive material on a substrate from corresponding precursor(s), comprising liquid delivery and flash vaporization thereof to yield a precursor vapor, and transporting the precursor vapor to a chemical vapor deposition reactor for formation of the thin film material on the substrate.

The precursor(s) in the above-described method may suitably comprise organometallic compounds or coordinated complexes of metal(s) selected from the group consisting of barium, strontium, calcium, and magnesium, in combination with lanthanum and manganese precursors. More generally, metal β-diketonate compounds or Lewis base coordinated complexes of such compounds are utilized. Alternatively, such compounds or complexes may be either fluorinated or non-fluorinated in character, and may include metal (β-diketonates), pivalates, and Lewis base adducts of each.

The manganate materials may be $La_xMg_yMnO_3$, $La_xCa_yMnO_3$, $La_xSr_yMnO_3$, $La_xBa_yMnO_3$ or other useful manganate materials. Careful control of the stoichiometry is critical to the observed properties in $La_xM_yMnO_3$, such that (x+y)<1.0, and more preferably between 0.6 and 0.9, and the stoichiometric oxygen content may be $\geq 3.0$. In some applications, other elemental dopants may advantageously be added to provide appropriate physical properties in the resulting doped manganate film.

In a particular aspect, the lanthanum calcium manganese oxide (LCMO) precursor(s) are dissolved in a solvent and flash vaporized at a temperature of between 100° C. and 300° C. The precursor vapor is transported to the chemical vapor deposition reactor in a carrier gas, such as argon, nitrogen, neon, helium or ammonia. The carrier gas may be mixed with an oxidizing co-reactant gas prior to its transport to the chemical vapor deposition reactor.

Although any suitable process conditions may be employed, the chemical vapor deposition reactor may contain substrate articles which preferably are heated for the chemical vapor deposition reaction to a temperature in the range of from 300° C. to 1000° C. The pressure of the precursor vapor in the chemical vapor deposition reactor may be from about 0.1 to about 760 torr, at such temperature.

The invention in another aspect relates to a device comprising a manganate layer on a substrate, wherein the manganate layer is formed on the substrate by a process including: providing corresponding precursor(s) for the manganate layer, transporting the precursor(s) by liquid delivery and flash vaporization thereof, to yield a precursor vapor, and transporting the precursor vapor to a chemical vapor deposition reactor for formation of the thin film LCMO material on the substrate.

In another aspect, the invention relates to a composition of a thin film manganate material on a substrate of the previously described magnetoresistive character, wherein the material is A deficient and doped with a Group II element (i.e., Mg, Ca, Sr, Ba).

The invention broadly contemplates high temperature magnetoresistive materials of the formula $La_xM_yMnO_3$ wherein $(x+y) \leq 1.0$, preferably from about 0.5 to about 0.99, and most preferably from about 0.6 to about 0.9, and wherein the stoichiometric oxygen content may be $\geq 3.0$.

Other objects and advantages of the invention will be more fully apparent from the ensuing disclosure.

DETAILED DESCRIPTION OF THE INVENTION AND PREFERRED EMBODIMENTS THEREOF

Concerning the method for film growth utilized in the practice of the present invention, a low pressure CVD system can be modified for the deposition of manganate films using liquid delivery of metalorganic precursors. Any suitable apparatus can be used for such purpose, e.g., a Sparta® 450 liquid delivery system (commercially available from Advanced Technologies Materials Inc., Danbury, Conn. (ATMI)) integrated with an existing MOCVD system. Such a modified apparatus readily enables a liquid delivery technique for simultaneous, controlled introduction of metalorganic compounds to the CVD reactor.

In empirical work demonstrating the method of the present invention, the substrate assembly was calibrated over a temperature range of 300° C. to 850° C. using a pyrometer or thermocouple calibration. The calibration included two sample holder assemblies. The process system included plumbing and process gas regulators, mass-flow controllers and filters, the vaporizer and liquid delivery system, exhaust lines, and precursor assemblies in stainless steel vessels with level sensors.

In an illustrative preferred embodiment, precursors were dissolved in a solvent and flash vaporized at temperatures between approximately 100° C. and approximately 300° C. and carried into the metalorganic chemical vapor deposition (MOCVD) reactor with a carrier gas (e.g., Ar, $N_2$, He, or $NH_4$). The precursors were then mixed with an oxidizing coreactant gas (e.g., $O_2$, $N_2O$, O3) and undergo decomposition at a substrate heated to between approximately 300° C. and approximately 800° C. at chamber pressures between approximately 0.1 torr and approximately 760 torr. Other active oxidizing species may be used to reduce deposition temperature, as for example through the use of a remote plasma source. Compatible precursor chemistries are required for optimum vaporization, transport and film growth. Further, the choice of chemistry is critical for obtaining uniform film growth and particle-free films.

Figure 4:
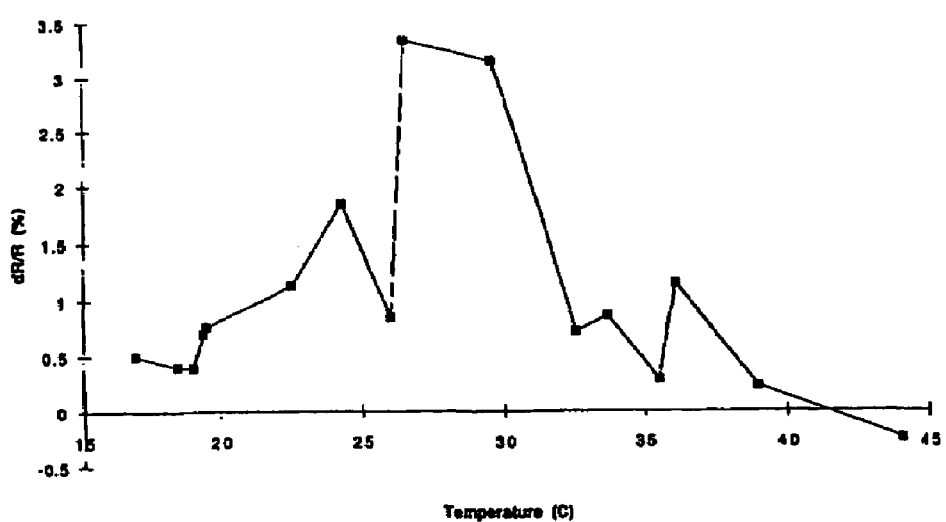
FIG. 4 illustrates the MR response in a fixed magnetic field (470 Oe) applied perpendicular to the LCMO film as a function of temperature over a narrow range. The maximum response is roughly 3.5% at 27° C., as another embodiment of the present invention.
Figure 5:
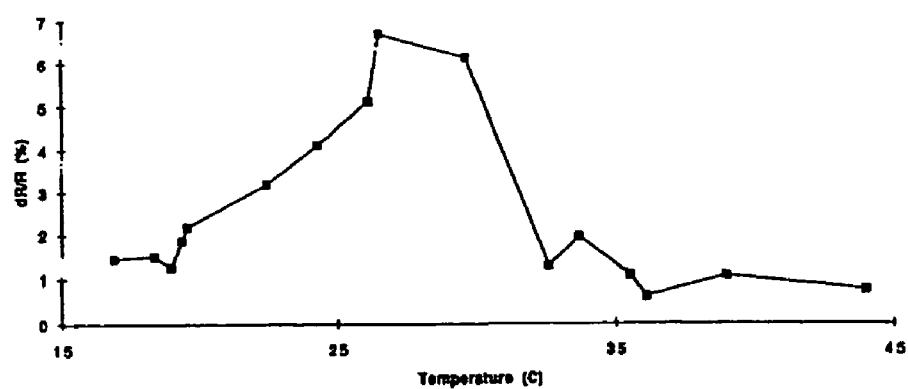
FIG. 5 illustrates the MR response in a small magnetic field (700 Oe) applied perpendicular to the LCMO film as a function of temperature over a narrow range. The maximum response is roughly 7% at 27° C., as yet another embodiment of the present invention.

Metalorganic precursors for MOCVD of doped manganates in the broad pactice of the invention comprise safe, low vapor pressure metalorganic sources, including non-fluorinated and fluorinated β-diketonates, optionally with Lewis base adducts. Vaporization conditions were selected for non-fluorinated compounds, which yielded efficient gas-phase transport. The MOCVD chamber was adapted for liquid delivery and a process according to the invention was carried out which yielded manganate films on MgO or $LaAlO_3$ substrates at relatively low temperatures (650° C.), with very high crystalline quality as demonstrated by x-ray diffraction patterns. Fluorinated β-diketonates may be employed to achieve even higher growth rates, based upon their transport as determined by thermal gravimetric analysis (TGA) and differential scanning calorimetry (DSC), if fluorinated oxides formation is suppressed or eliminated by the process conditions utilized, which may be readily determined by those of ordinary skill without undue experimentation. Magnetic characterization of as-deposited and thermally annealed films yielded magneto-resistance responses in large fields ($\geq 10$ Tesla) and small fixed fields (1–1000 Oersted). The magneto-resistance (MR) response is strongly dependent on the film temperature, as shown in FIGS. 4 and 5 over a narrow temperature regime.

The metal pivalates, lanthanum (III) tris(2,2,6,6-tetramethyl-3,5-heptanedione), $La(thd)_3$, manganese (III) tris(2,2,6,6-tetramethyl-3,5-heptanedione), $Mn(thd)_3$, and Group II metals (M=Mg, Ca, Sr and Ba)bis(2,2,6,6-tetramethyl-3,5-heptanedione) and their respective Lewis base adducts are suitable for transport and film growth in the practice of the present invention. For robust, precisely reproducible film growth, the Lewis base adducts of the precursors may be preferred.

Using (thd) ligands for the metal precursors is advantageous because the resulting coordinated complexes are readily transported without decomposition for MOCVD of doped manganates. Lewis base adducts are also suitable for robust transport. In general, low melting points, high solubility and efficient thermal transport are desirable characteristics of the precursor complexes.

Although the thd complexes of La, Mn and Group II elements may be most preferred candidates for liquid delivery CVD of the doped managanate films, Lewis base adducts of $M(thd)_2$ and $M(\beta$-diketonate$)_2$, where M=Mg, Ca, Sr and Ba, are also highly advantageous in producing a robust and unique chemical pathway to CVD manganate films. The β-diketonates of the elements will be known to those skilled in the art of precursor chemistry and organometallic or inorganic chemistry.

A series of films was deposited using different precursor solution concentrations to afford films of varying stoichiometries. The deposited films were analyzed, and the measured film composition and calculated stoichiometric ratios were used to compile Tables I and II, set out below.

The maxima in RT values in the above tabulated data is seen to vary with stoichiometric composition, especially after thermal annealing. The optimum composition space for $RT_{max}$ is complicated in the as-deposited films. In the as-deposited samples, an indirect correlation was observed and indicative of scatter related to the CVD process. Also, the values of $RT_{max}$ temperatures measured in the as-deposited films were low relative to the annealed films. Nonethe-

TABLE I

| Samp # | R(Ω) 0 Oe | R(Ω) 250 Oe | MR % | La % (A1) | Ca % (A2) | Mn % (B) | $RT_{max}$ Deposited | $RT_{max}$ Annealed | A/B Ratio | Ca/La Ratio |
|---|---|---|---|---|---|---|---|---|---|---|
| 34 | 480 | 480 | 0 | + | + | + | ~ | ~ | + | + |
| 64 | 380 | 376 | 1 | 28.8 | 12.8 | 58.4 | 285 | 308 | 0.71 | 0.44 |
| 65 | 722 | 714 | 1.1 | 25.9 | 12.2 | 61.9 | + | + | 0.62 | 0.47 |
| 66 | 357 | 354 | 0.8 | 28.9 | 11.5 | 59.6 | 289 | 318 | 0.68 | 0.40 |
| 67 | 1920 | 1907 | 0.8 | 28.5 | 13.8 | 57.7 | 246 | 305 | 0.73 | 0.48 |
| 68 | * | * | 0.6 | 29.2 | 12.2 | 58.6 | 280 | 311 | 0.71 | 0.42 |
| 70 | 201 | 197 | 1.8 | 29.0 | 13.5 | 59.4 | 283 | 317 | 0.73 | 0.41 |
| 71 | 116 | 113.9 | 1.9 | 28.4 | 11.6 | 60 | 291 | 321 | 0.67 | 0.39 |
| 72 | 347 | 344.7 | 0.7 | 27.5 | 12.1 | 60.4 | 287 | 318 | 0.66 | 0.44 |
| 74 | 396.9 | 396.5 | 0.1 | 30.6 | 15.5 | 54.0 | 272 | 304 | 0.85 | 0.51 |
| 76 | 117 | 117 | 0 | 33.0 | 19.4 | 47.61 | 249 | 289 | 1.1 | 0.59 |

TABLE II

| Samp # | % La | % Ca | % Mn | La (A1) | Ca (A2) | Mn (B) | Ca/La Ratio | A/B Ratio | Tc as-dep | Tc anneal | % MR § (T °C.) |
|---|---|---|---|---|---|---|---|---|---|---|---|
| 55¤ | 33 | — | 57 | 0.58 | — | 1 | — | 0.58 | | 334 | 1.8 (47) |
| 66 | 28.9 | 11.5 | 59.6 | 0.49 | 0.19 | 1 | 0.39 | 0.68 | 289 | 317 | 4.4 (30) |
| 70¥ | 29 | 13.5 | 59.4 | 0.49 | 0.24 | 1 | 0.49 | 0.73 | 289 | 317 | 6.7 (27) |
| 71¥ | 28.4 | 11.6 | 60 | 0.48 | 0.19 | 1 | 0.39 | 0.67 | 291 | 321 | 4.7 (28) |
| 80 | 35.4 | 12.0 | 52.6 | 0.67 | 0.23 | 1 | 0.34 | 0.90 | 289 | — | |
| 84* | 26.2 | 12.0 | 61.8 | 0.42 | 0.19 | 1 | 0.46 | 0.62 | 217 | 308 | 4.5 (31) |
| 85 | 26.2 | 19.5 | 54.3 | 0.48 | 0.36 | 1 | 0.74 | 0.84 | 262 | 285 | |
| 86* | 29.7 | 16.8 | 53.4 | 0.56 | 0.32 | 1 | 0.57 | 0.87 | 268 | 294 | |
| 88* | 27.9 | 13.4 | 58.8 | 0.52 | 0.21 | 1 | 0.48 | 0.70 | 291 | 32 | 5.1 (29) |
| 89* | 26.3 | 15.4 | 27.9 | 0.45 | 0.26 | 1 | 0.56 | 0.72 | 263 | 312 | 4.5 (24) |
| 90 | 29.2 | 11.7 | 59.1 | 0.49 | 0.20 | 1 | 0.40 | 0.69 | 288 | 318 | |
| 92* | 35.5 | 12.9 | 51.7 | 0.69 | 0.25 | 1 | 0.36 | 0.93 | 155 | 281 | |
| 95* | 28.6 | 17.0 | 54.4 | 0.52 | 0.31 | 1 | 0.59 | 0.84 | 291 | 296 | 1.0 (17) |
| 96* | 35.3 | 11.1 | 53.6 | 0.66 | 0.21 | 1 | 0.31 | 0.86 | 272 | 315 | |
| 97* | 34.6 | 11.4 | 54.1 | 0.64 | 0.21 | 1 | 0.33 | 0.85 | 294 | 319 | |
| 98* | 33.6 | 13.6 | 52.8 | 0.64 | 0.26 | 1 | 0.41 | 0.89 | 280 | 316 | |
| 99* | 37.2 | 12.6 | 50.2 | 0.74 | 0.25 | 1 | 0.34 | 0.99 | 274† | 303 | |
| 100* | 32.4 | 14.9 | 52.6 | 0.62 | 0.28 | 1 | 0.46 | 0.90 | 293 | 313 | |
| 101 | 34.7 | 9.7 | 55.6 | 0.62 | 0.17 | 1 | 0.28 | 0.80 | 184 | 308 | |
| 107* | 34.5 | 11.2 | 54.3 | 0.64 | 0.21 | 1 | 0.32 | 0.84 | 273 | 324 | |
| 108* | 37.1 | 11.8 | 51.1 | 0.72 | 0.23 | 1 | 0.32 | 0.96 | 247 | 306 | |
| 109* | 33.1 | 14.5 | 52.4 | 0.63 | 0.28 | 1 | 0.44 | 0.91 | 266 | 299 | |
| 110* | 36.0 | 11.9 | 52.1 | 0.69 | 0.23 | 1 | 0.33 | 0.92 | 260 | 296 | |
| 111* | 26.9 | 22.9 | 50.3 | 0.54 | 0.45 | 1 | 0.85 | 0.99 | 287 | 296 | |
| 112* | 33.8 | 13.1 | 53.1 | 0.64 | 0.25 | 1 | 0.39 | 0.88 | 266 | 292 | 1.0 (17) |
| 113* | 34.7 | 13.7 | 51.5 | 0.67 | 0.27 | 1 | 0.39 | 0.94 | 255 | 303 | |
| 114* | 35.3 | 13.8 | 50.9 | 0.69 | 0.27 | 1 | 0.39 | 0.96 | 270 | 310 | |
| 115* | 31.7 | 15.5 | 52.8 | 0.60 | 0.29 | 1 | 0.49 | 0.89 | 267 | 299 | |

*indicates ICP-MS data was obtained from a film deposited onto an MgO substrate; all other measurements were taken from films deposited during the same deposition run onto $LaAlO_3$ substrates.
§ indicates the MR ratio measured when a 700 Oe fixed magnetic field is applied perpendicular to the substrate. Most samples were measured after thermal annealing in $O_2$.
¥Entire data set was obtained using both high and low magnetic field measurements and chemical analyses.
¤LSMO sample deposited using similar techniques.

Measured elemental composition of LCMO films was determined by inductively coupled plasma-mass spectroscopy (ICP-MS) analysis and calculated film stoichiometries from the data. Measured electrical properties were determined for the same films. The film stoichiometry and electromagnetic responses are listed for the series of films deposited by MOCVD.

less, a correlation to the composition of the deposited film can be seen especially in the values of A:Mn≧1.0 and for Ca:La ratios of 0.3 to 0.5. For the thermally annealed films, A (La and Ca) deficient compositions exhibited higher $RT_{max}$ temperatures. The range of useful compositions varied widely between 60 and 90% A ($Ca^+$ La) relative to the Mn content. The Ca/La ratio is critical towards the $RT_{max}$; values between 0.4 to 0.5 clearly display higher $RT_{max}$ after thermal annealing. Increasing the Ca/La ratio, demonstrateds a decreasing trend in $RT_{max}$ temperatures, especially for values of (La+Ca): Mn of $\geq 1.0$. At lower (La+Ca): Mn ratios (0.6 to 1.0) this same trend applies, but to a decreased extent. Based on the measured $RT_{max}$ values, the most preferred compositional space is for (La+Ca):Mn films between 0.6 and 0.75 with Ca/La ratios of 0.35 to 0.55.

Specific embodiments of the present invention are further described in the following, nonlimiting examples which will serve to illustrate various features, aspects and embodiments of significance. The examples are intended merely to facilitate an understanding of ways in which the present invention may be practiced and to further enable those of skill in the art to practice the present invention. Accordingly, the examples should not be construed as limiting the scope of the present invention.

EXAMPLE I

MOCVD of LCMO and Film Characterization

Thin-film growth was carried out in an inverted vertical MOCVD reactor described in J. Zhang, R. A. Gardiner, P. S. Kirlin, R. W. Boerstler, and J. Steinbeck, Appl. Phys. Lett. 61, 2882 (1992); and Y. Q. Li, J. Zhang, S. Pombrick, S. DiMascio, W. Stevens, Y. F. Yan, and N. P. Ong, J. Mater. Res. 10, 2166 (1995). An organic solution containing the metal precursors was transported to the reactor at ~7 mmol/hour using a liquid delivery and vaporizer system (ATMI). The precursors used for deposition were tris(2,2,6,6-tetramethyl-3,5-heptanedionato)lanthanum, $(La(thd)_3)$, tris(2,2,6,6-tetramethyl-3,5-heptanedionato)manganese, $(Mn(thd)_3)$, and bis(2,2,6,6-tetramethyl-3,5-heptanedionato) calcium, $Ca(thd)_2$, prepared at ATMI. The precursor solution was vaporized in a heated zone, and transported to the substrate using a nitrogen carrier gas flowing at 100 sccm. Oxidizer gases were introduced in the region of the substrate at rates of 300 sccm for oxygen and 250 sccm for nitrous oxide. The reactor base pressure was maintained at 1.5 Torr by a throttle valve on a vacuum pump.

Films were grown on [001] polished $LaAlO_3$ and cleaved MgO substrates. The films were deposited at a susceptor temperature of 650° C., measured at the center of the heated pedestal. The actual substrate surface temperature may vary with the thermal properties of the substrate. The duration of film growth was 1.0 h and yields ~0.3 μm thick films on $LaAlO_3$. Following deposition, the precursor solution delivery was halted, the chamber was backfilled with oxygen to atmospheric pressure, and the susceptor temperature was reduced by 15° C./min to room temperature. Films were deposited with various ratios of (La+Ca):Mn and La:Ca. Film stoichiometry was determined by inductively coupled plasma (ICP) spectrometry of dissolved films. Energy dispersive x-ray analysis (EDX) was used on an MgO substrate used to monitor film growth. The Tc of the LCMO films was obtained by measuring four-point probe resistance, using a Keithley 224 current source and a Keithley 181 voltmeter, as a function of temperature. Four copper wire contacts were aligned ~2 mm apart, affixed to the film by silver paint. The temperature was measured by a Lake Shore DRC-91 CA controller monitoring a thermocouple attached to the film. The film was placed in liquid nitrogen which was then allowed to boil off. As the film slowly warmed to room temperature, a computer interface with LabVIEW software measured the resistance as a function of sample temperature. The resistance of the circuit was then plotted versus temperature to determine the peak temperature. If the transition temperature was above ambient temperature (295 K), a lamp was used to increase the sample temperature. Both as-deposited and $O_2$ thermally annealed samples were measured for comparison. FIGS. 1 through 10 are indicative of electrical, magnetic and magnetoresistive performance in A site deficient doped manganate.

Figure 1:
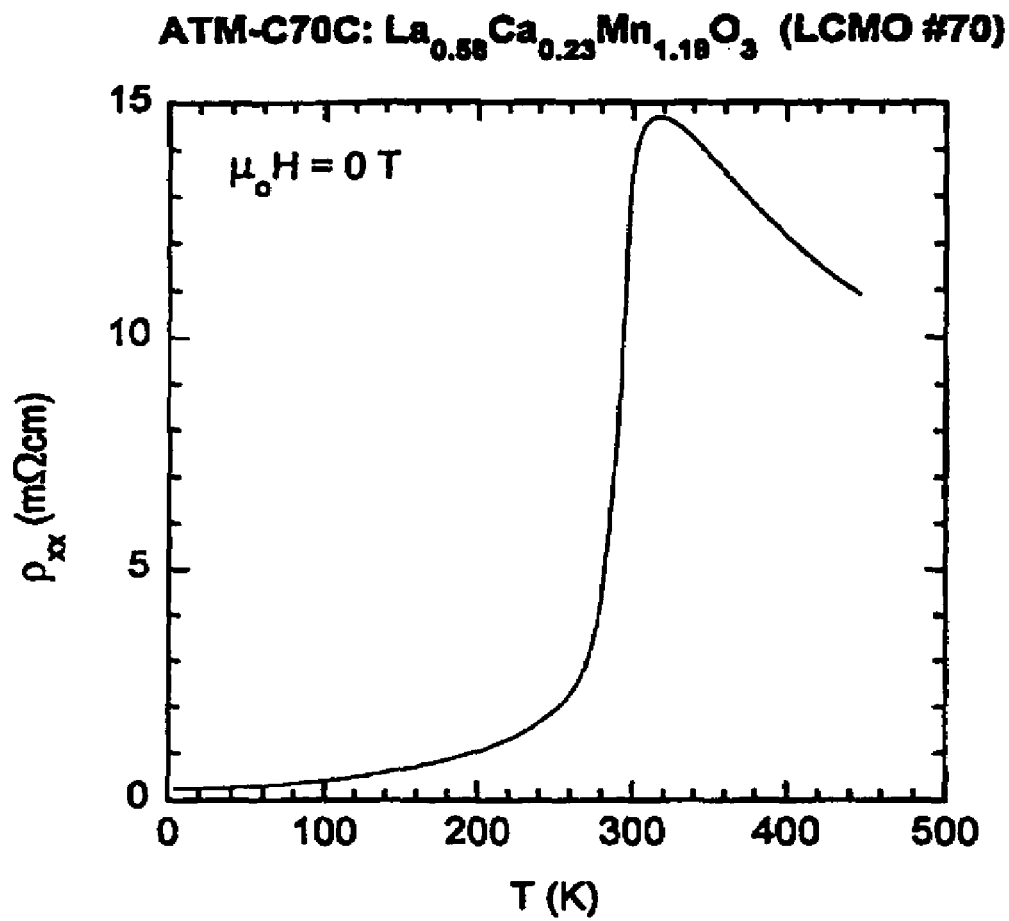
FIG. 1 illustrates the measured resistivity (ρ) versus temperature (T in Kelvins) for an LCMO film having a stoichiometry of $La_{0.49}Ca_{0.24}MnO_3$. The $T_c$ (317 K) was measured after thermal annealing in oxygen, as an illustrative embodiment of the present invention.

FIG. 1 illustrates the measured resistivity (ρ) versus temperature (T in K) for an LCMO film having a stoichiometry of $La_{0.49}Ca_{0.24}MnO_3$. The $T_c$ (317 K) was measured after thermal annealing in oxygen, as an illustrative embodiment of the present invention.

Figure 2:
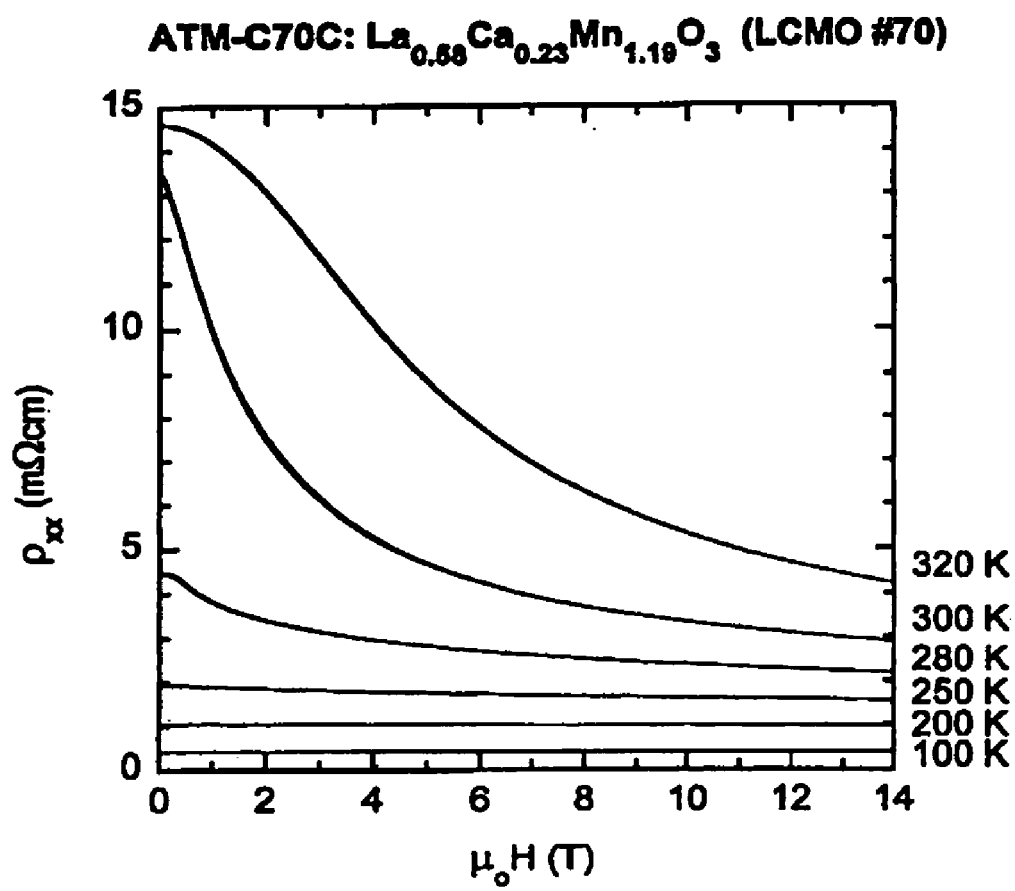
FIG. 2 illustrates the measured resistivity (ρ) versus the Hall mobility in an applied magnetic field (T) at several temperatures (K) for a film stoichiometry of $La_{0.49}Ca_{0.24}MnO_3$ by ICP-MS analysis, as another illustrative aspect of the present invention.

FIG. 2 illustrates the measured resistivity (p) versus the Hall mobility in an applied magnetic field (T) at several temperatures (K) for a film stoichiometry of $La_{0.49}Ca_{0.24}MnO_3$ by ICP-MS analysis, as another illustrative aspect of the present invention.

Figure 3:
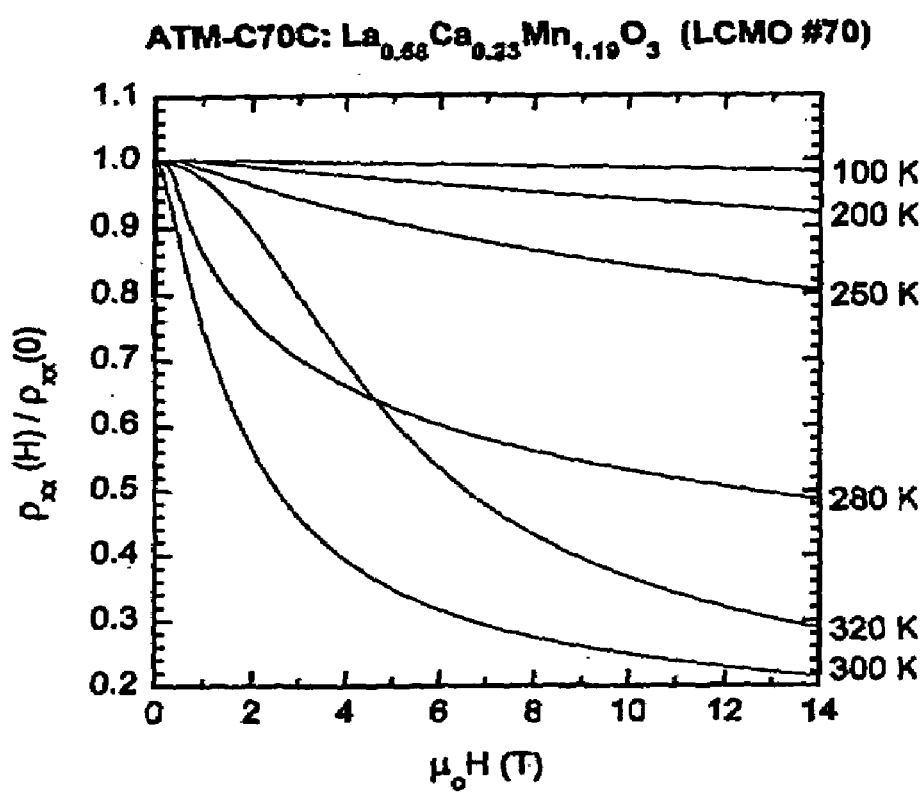
FIG. 3 illustrates the ratio of the Hall resistivity to normal resistivity (no applied field) for as a function of the Hall mobility in an applied magnetic field at several temperatures (K), for a film stoichiometry of $La_{0.49}Ca_{0.24}MnO_3$. A crossover was observed between 280 and 320K, for this film, as a further embodiment of the present invention.

FIG. 3 illustrates the ratio of the Hall resistivity to normal resistivity (no applied field) for as a function of the Hall mobility in an applied magnetic field at several temperatures (K), for a film stoichiometry of $La_{0.49}Ca_{0.24}MnO_3$. A cross-over was observed between 280 K and 320 K, for this film, as a further embodiment of the present invention.

FIG. 4 illustrates the MR response in a fixed magnetic field (470 Oe) applied perpendicular to the LCMO film as a function of temperature over a narrow range. The maximum response is roughly 3.5% at 27° C., as another embodiment of the present invention.

FIG. 5 illustrates the MR response in a small magnetic field (700 Oe) applied perpendicular to the LCMO film as a function of temperature over a narrow range. The maximum response is roughly 7% at 27° C., as yet another embodiment of the present invention.

Figure 6:
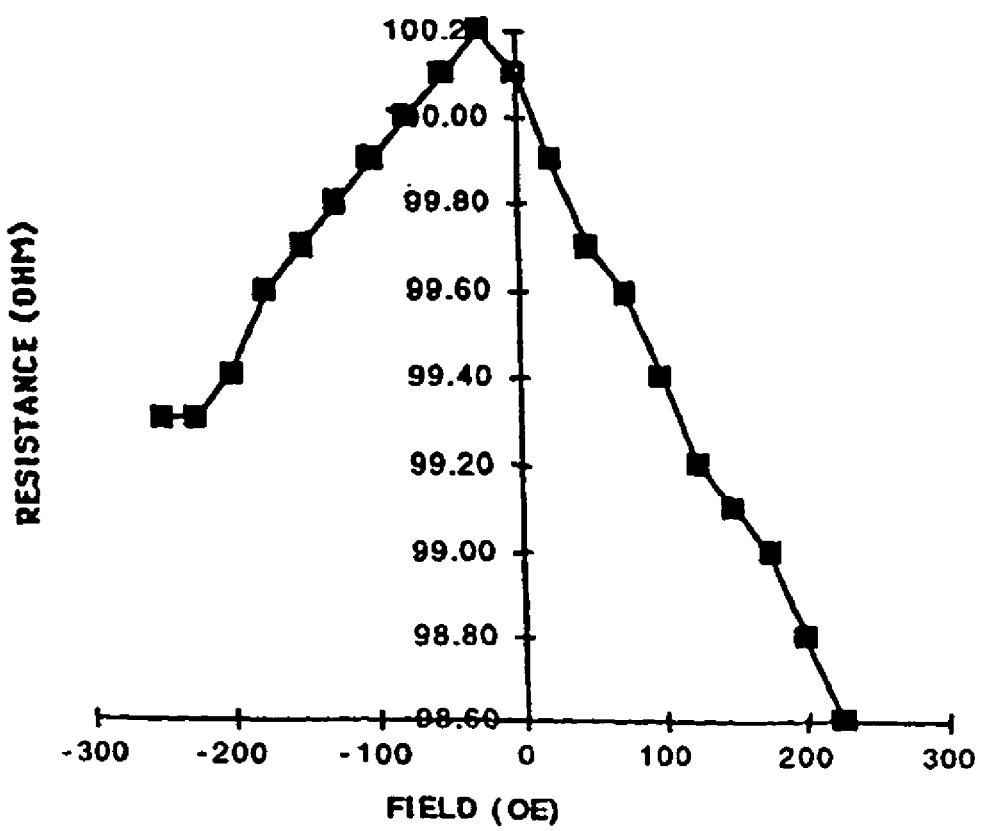
FIG. 6 illustrates the MR response in a small variable magnetic field from −250 to +250 Oe applied perpendicular to the LCMO film. A hysteresis in the measured resistance was observed in the thin film of LCMO, formed in accordance with the present invention.

FIG. 6 illustrates the MR response in a small variable magnetic field from –250 Oe to +250 Oe applied perpendicular to the LCMO film. A hysteresis in the measured resistance was observed in the thin film of LCMO, formed in accordance with the present invention.

Figure 7:
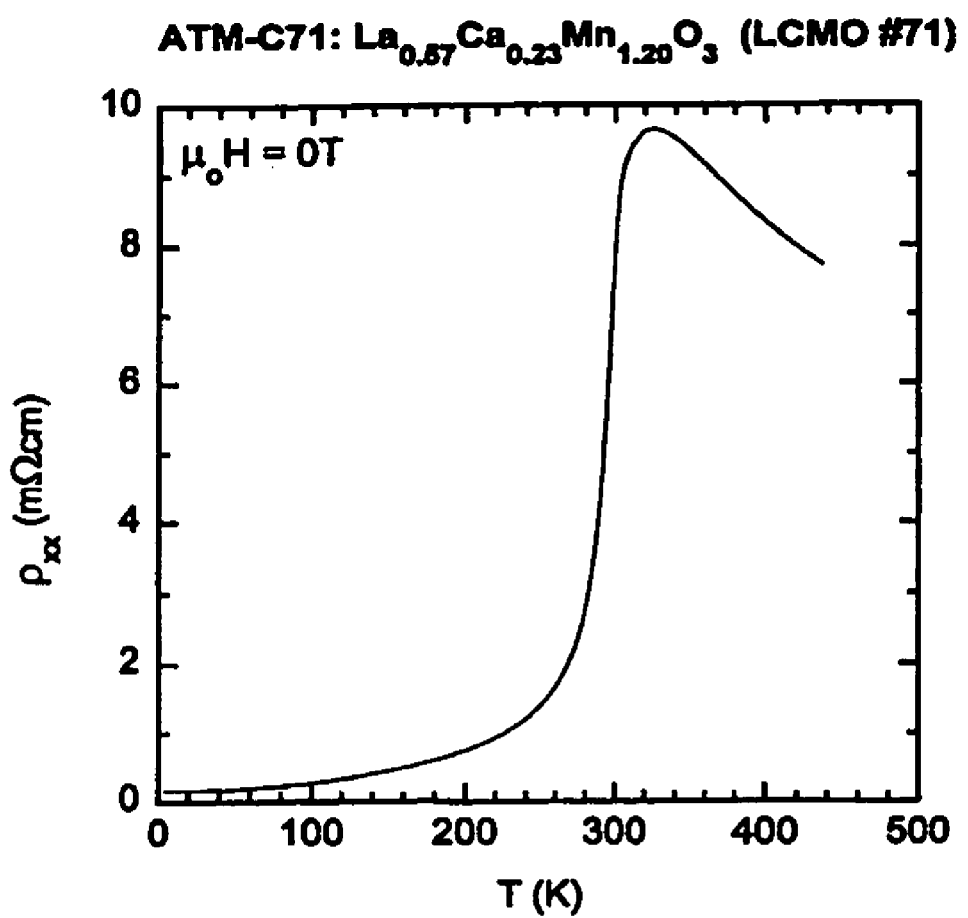
FIG. 7 illustrates the measured resistivity ($\rho$) versus temperature (T in K) for a film stoichiometry of $La_{0.48}Ca_{0.19}MnO_3$ measured by ICP-MS analysis. The $T_c$ (321 K) was measured after thermal annealing in oxygen, as another aspect of the present invention

FIG. 7 illustrates the measured resistivity (p) versus temperature (T in K) for a film stoichiometry of $La_{0.48}Ca_{0.19}MnO_3$ measured by ICP-MS analysis. The $T_c$ (321 K) was measured after thermal annealing in oxygen, as another aspect of the present invention.

Figure 8:
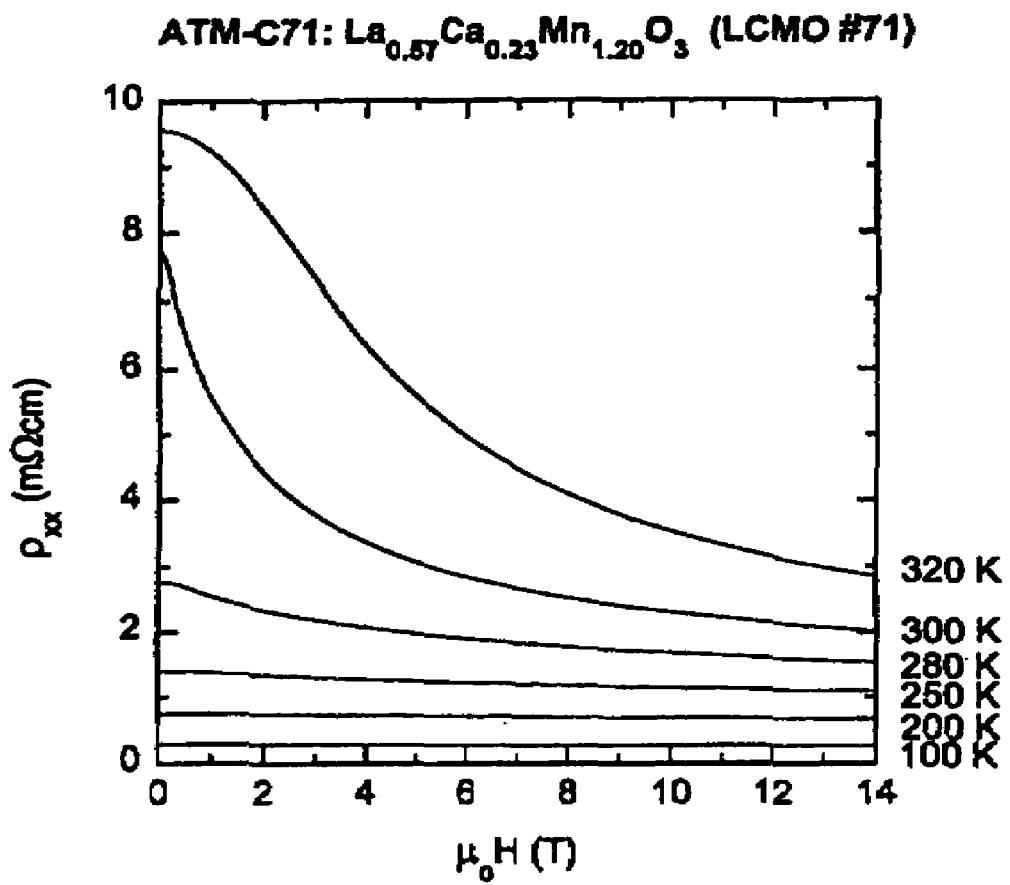
FIG. 8 illustrates the measured resistivity ($\rho$) versus the applied magnetic field at several temperatures (K) for a film stoichiometry of $La_{0.48}Ca_{0.19}MnO_3$ deposited by MOCVD, as yet another embodiment of the present invention.

FIG. 8 illustrates the measured resistivity (ρ) versus the applied magnetic field at several temperatures (K) for a film stoichiometry of $La_{0.48}Ca_{0.19}MnO_3$ deposited by MOCVD, as yet another embodiment of the present invention.

Figure 9:
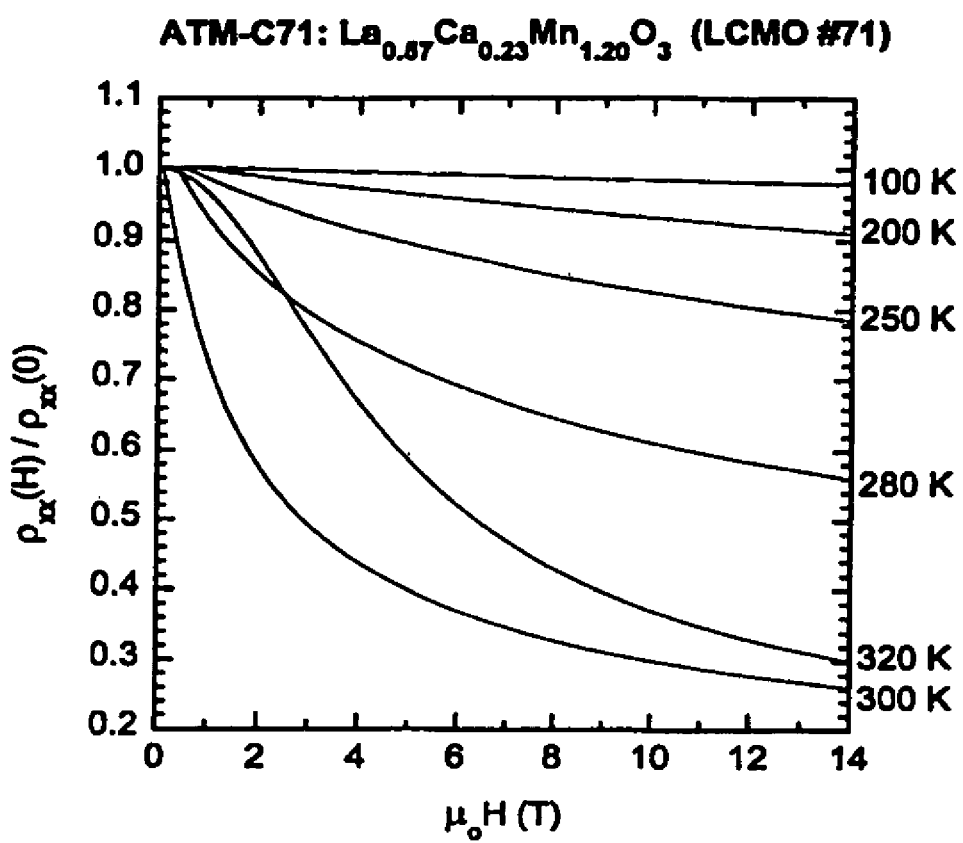
FIG. 9 illustrates the ratio of the Hall resistivity to normal resistivity (no applied field) as a function of the Hall mobility in an applied magnetic field at several temperatures (K). This sample had a film stoichiometry of $La_{0.48}Ca_{0.19}MnO_3$ and a cross-over was observed between 280 and 320 K, as a further embodiment of the present invention.

FIG. 9 illustrates the ratio of the Hall resistivity to normal resistivity (no applied field) as a function of the Hall mobility in an applied magnetic field at several temperatures (K). This sample had a film stoichiometry of $La_{0.48}Ca_{0.19}MnO_3$ and a cross-over was observed between 280 K and 320 K, as a further embodiment of the present invention.

Figure 10:
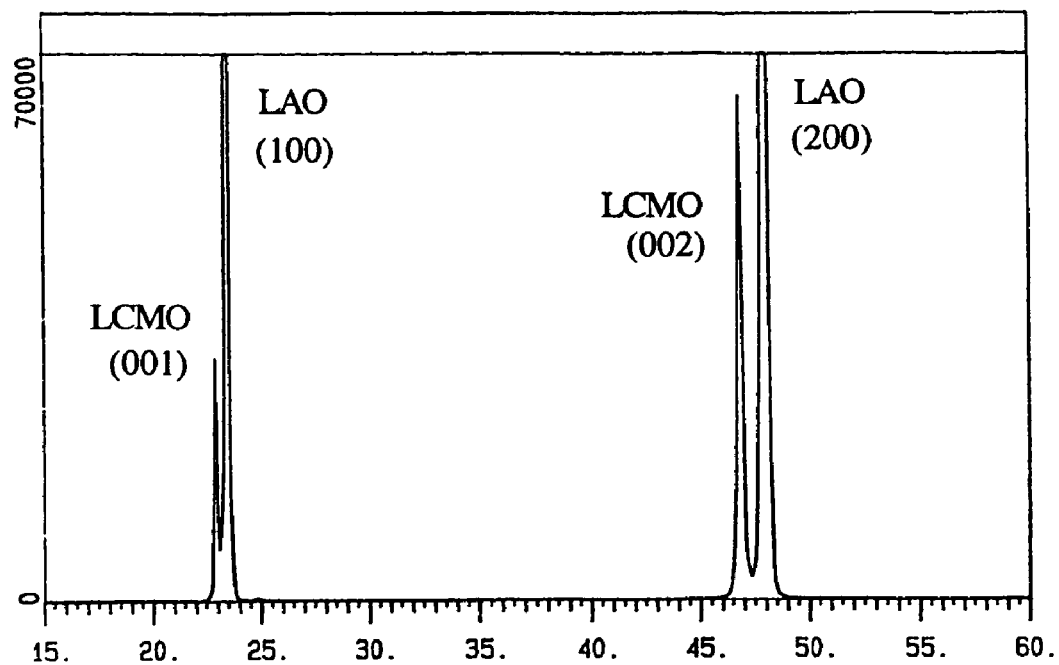
FIG. 10 illustrates an X-ray diffraction spectrum obtained from an LCMO film grown on $LaAlO_3$ after thermal annealing in $O_2$ at 1000° C., representing another embodiment of the present invention.

FIG. 10 illustrates an X-ray diffraction spectrum obtained from an LCMO film grown on $LaAlO_3$ after thermal annealing in $O_2$ at 1000° C., representing another embodiment of the present invention.

EXAMPLE II

MOCVD of LSMO and Film Characterization

Thin-film growth was carried out in an inverted vertical MOCVD reactor as described in Example I. An organic solution containing the metal precursors was transported to the reactor at ~7 mmol/hour using a liquid delivery and vaporizer system (ATMI). The precursors used for deposition were tris(2,2,6,6-tetramethyl-3,5-heptanedionato)lanthanum, (La(thd)$_3$), tris(2,2,6,6-tetramethyl-3,5-heptanedionato) manganese, (Mn(thd)$_3$), and bis(2,2,6,6-tetramethyl-3,5-heptanedionato) strontium, Sr(thd)$_2$, prepared at ATMI. The precursor solution was vaporized in a heated zone, and transported to the substrate using a nitrogen carrier gas flowing at 100 sccm. Oxidizer gases were introduced in the region of the substrate at rates of 300 sccm for oxygen and 250 sccm for nitrous oxide. The reactor base pressure was maintained at 1.5 Torr by a throttle valve on a vacuum pump.

Figure 11:
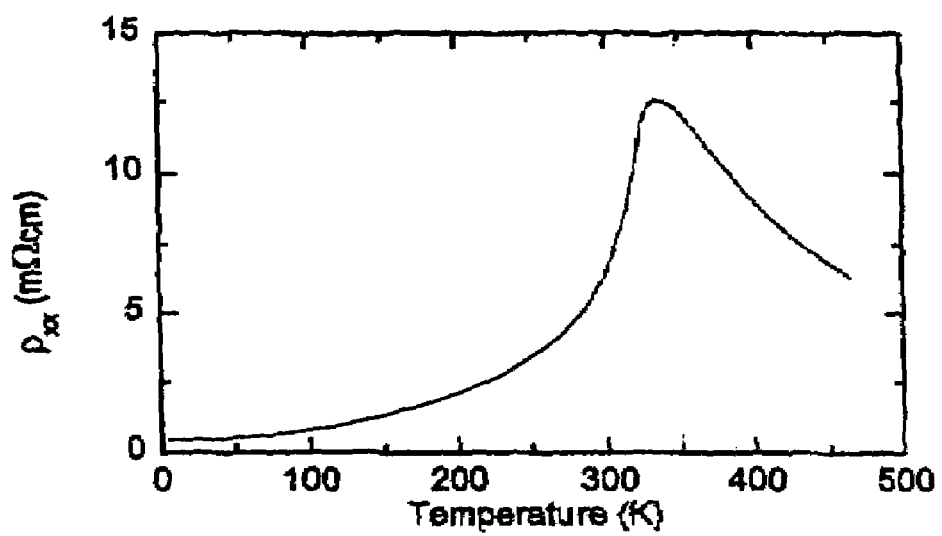
FIG. 11 illustrates the resistance versus temperature for an MOCVD film of $La_{0.58}Sr_{0.18}MnO_3$ grown by liquid delivery (A/B ratio Of 0.76) and a room temperature MR of 1.8% at 47° C. in a field of 700 Oe. This is the highest temperature MR response reported to date. This film also exhibited less "noise" and a better stability in small magnetic fields. The same trend was observed in LSMO films generally, namely, that A deficient films provide room temperature MR response, as yet another aspect of the present invention.

Films were grown on [001] polished LaAlO$_3$ and cleaved MgO substrates. The films were deposited at a susceptor temperature of 650° C., measured at the center of the heated pedestal. The actual substrate surface temperature may vary with the thermal properties of the substrate. The duration of film growth was 1.0 h and yields ~0.3 μm thick films on LaAlO$_3$. Following deposition, the precursor solution delivery was halted, the chamber was backfilled with oxygen to atmospheric pressure, and the susceptor temperature was reduced by 15° C./min to room temperature. Films were deposited with various ratios of (La+Sr):Mn and La:Sr. Film stoichiometry was determined by inductively coupled plasma (ICP) spectrometry of dissolved films. Energy dispersive x-ray analysis (EDX) was used on an MgO substrate used to monitor film growth. The Tc of the LSMO films was obtained by measuring four-point probe resistance, using a Keithley 224 current source and a Keithley 181 voltmeter, as a function of temperature. Four copper wire contacts were aligned ~2 mm apart, affixed to the film by silver paint. The temperature was measured by a Lake Shore DRC-91 CA controller monitoring a thermocouple attached to the film. The film was placed in liquid nitrogen which was then allowed to boil off. As the film slowly warmed to room temperature, a computer interface with LabVIEW software measured the resistance as a function of sample temperature. The resistance of the circuit was then plotted versus temperature to determine the peak temperature, as shown in FIG. 11. If the transition temperature was above ambient temperature (295 K), a lamp was used to increase the sample temperature. Both as-deposited and O$_2$ thermally annealed samples were measured for comparison. An X-ray diffraction pattern for the deposited film is shown in FIG. 12 after thermal annealing in O$_2$.

FIG. 11 illustrates the resistance versus temperature for an MOCVD film of La$_{0.58}$Sr$_{0.18}$MnO$_3$ grown by liquid delivery (A/B ratio Of 0.76) and a room temperature MR of 1.8% at 47° C. in a field of 700 Oe. This is the highest temperature MR response reported to date. This film also exhibited less "noise" and a better stability in small magnetic field. The same trend was observed in LSMO films generally, namely, that A deficient films provide roome temperature MR response.

FIG. 11 illustrates the resistance versus temperature for an MOCVD film of La$_{0.58}$ Sr$_{0.18}$MnO$_3$ grown by liquid delivery (A/B ratio Of 0.76) and a room temperature MR of 1.8% at 47° C. in a field of 700 Oe. This is the highest temperature MR response reported to date. This film also exhibited less "noise" and a better stability in small magnetic field. The same trend was observed in LSMO films generally, namely, that A deficient films provide room temperature MR response, as yet another aspect of the present invention.

Figure 12:
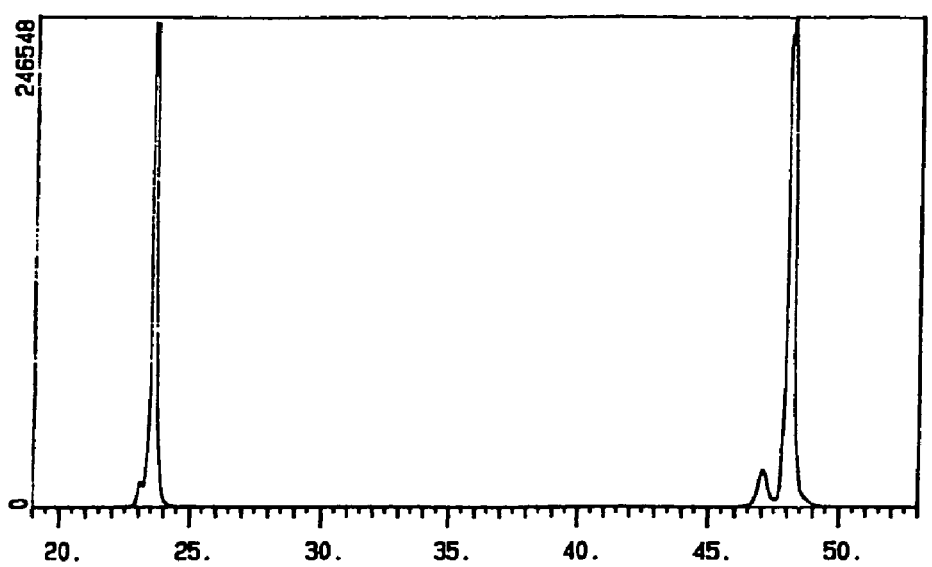
FIG. 12 illustrates an X-ray diffraction spectrum obtained from an lanthanum strontium manganese oxide film grown on $LaAlO_3$ after thermal annealing in $O_2$ at 1000° C., according to yet another embodiment of the present invention.

FIG. 12 illustrates an X-ray diffraction spectrum obtained from an LSMO film grown on LaAlO$_3$ after thermal annealing in O$_2$ at 1000° C., according to yet another embodiment of the present invention.

EXAMPLE III

MOCVD of LBMO and Film Characterization

Thin-film growth was carried out in an inverted vertical MOCVD reactor as described in Example I. An organic solution containing the metal precursors was transported to the reactor at ~7 mmol/hour using a liquid delivery and vaporizer system (ATMI). The precursors used for deposition were tris(2,2,6,6-tetramethyl-3,5-heptanedionato) lanthanum, (La(thd)$_3$), tris(2,2,6,6-tetramethyl-3,5-heptanedionato) manganese, (Mn(thd)$_3$), and bis(2,2,6,6-tetramethyl-3,5-heptanedionato) barium, Ba(thd)$_2$, prepared at ATMI. The precursor solution was vaporized in a heated zone, and transported to the substrate using a nitrogen carrier gas flowing at 100 sccm. Oxidizer gases were introduced in the region of the substrate at rates of 300 sccm for oxygen and 250 sccm for nitrous oxide. The reactor base pressure was maintained at 1.5 Torr by a throttle valve on a vacuum pump.

Films were grown on [001] polished LaAlO$_3$ and cleaved MgO substrates. The films were deposited at a susceptor temperature of 650° C., measured at the center of the heated pedestal. The actual substrate surface temperature may vary with the thermal properties of the substrate. The duration of film growth was 1.0 h and yields ~0.3 μm thick films on LaAlO$_3$. Following deposition, the precursor solution delivery was halted, the chamber was backfilled with oxygen to atmospheric pressure, and the susceptor temperature was reduced by 15° C./min to room temperature. Films were deposited with various ratios of (La+Ba):Mn and La:Ba. Film stoichiometry was determined by inductively coupled plasma (ICP) spectrometry of dissolved films. Energy dispersive x-ray analysis (EDX) was used on an MgO substrate used to monitor film growth. The Tc of the LBMO films was obtained by measuring four-point probe resistance, using a Keithley 224 current source and a Keithley 181 voltmeter, as a function of temperature. Four copper wire contacts were aligned ~2 mm apart, affixed to the film by silver paint. The temperature was measured by a Lake Shore DRC-91CA controller monitoring a thermocouple attached to the film. The film was placed in liquid nitrogen which was then allowed to boil off. As the film slowly warmed to room temperature, a computer interface with LabVIEW software measured the resistance as a function of sample temperature. The resistance of the circuit was then plotted versus temperature to determine the peak temperature. If the transition temperature was above ambient temperature (295 K), a lamp was used to increase the sample temperature. Both as-deposited and O$_2$ thermally annealed samples were measured for comparison.

All the disclosed embodiments of the invention described herein can be realized and practiced without undue experimentation. Although the best mode contemplated by the inventors of carrying out the present invention is disclosed above, practice of the present invention is not limited thereto. It will be appreciated that various additions, modifications and rearrangements of the features of the present invention may be made without deviating from the spirit and scope of the underlying inventive concept. Accordingly, it will be appreciated by those skilled in the art that, within the scope of the appended claims, the invention may be practiced otherwise than as specifically described herein.

For example, the invention could be enhanced by providing additional ingredients in the precursor chemistry. Similarly, although the preferred percursor chemistry is described, any suitable materials could be used in its place.

In addition, the manganate layers need not be fabricated with the disclosed method, but could be fabricated using other suitable procedures. Further, although the doped manganates are described herein as physically unique materials, it will be apparent that the manganates may be integrated into devices with which they are associated, and that multiple layer structures and devices comprising such manganates are contemplated as being usefully employed in the broad practice of the present invention.

It will be recognized by practitioners that other methods may be employed to form manganate films with the stoichiometries of the present invention, for example; sol-gel deposition, sputtering, pulsed laster deposition or other physical deposition means.

What is claimed is:

1. A method of forming a doped A-site deficient manganate material on a substrate from corresponding precursor(s), comprising liquid delivery and flash vaporization thereof to yield a precursor vapor, transporting the precursor vapor to a chemical vapor deposition reactor for chemical vapor deposition formation of the manganate material on the substrate, said manganate material having the formula $La_xM_yMnO_3$, where M=Mg, Ca, Sr, or Ba, and $0.5<(x+y)<0.9$, and annealing the manganate material in an oxygen atmosphere for a sufficient time period to increase the Curie temperature of the manganate material in a range from 17° C. to about 50° C.

2. The method according to claim 1, wherein the precursor(s) comprise coordination compounds, or Lewis base complexes of metal(s) selected from the group consisting of lanthanum, magnesium, calcium, strontium, barium, and manganese.

3. The method according to claim 1, wherein the precursor(s) include metal β-diketonate compounds, metal pivalate compounds, or Lewis base complexes thereof.

4. The method according to claim 1, wherein the precursor(s) include metal fluorinated β-diketonate compounds, or Lewis base complexes thereof.

5. The method according to claim 1, wherein the precursor(s) include metal pivalate Lewis base adducts.

6. The method according to claim 1, wherein the chemical vapor deposition is plasma-assisted.

7. The method according to claim 1, wherein the precursor(s) are dissolved in a solvent and flash vaporized at a temperature of from about 100° C. to about 300° C.

8. The method according to claim 1, wherein the precursor vapor is transported to the chemical vapor deposition reactor in a carrier gas.

9. The method according to claim 8, wherein the carrier gas is selected from the group consisting of argon, nitrogen, neon, helium and ammonia.

10. The method according to claim 8, wherein the carrier gas is mixed with an oxidizing co-reactant gas in the chemical vapor deposition reactor or prior to transport to the chemical vapor deposition reactor.

11. The method according to claim 1, wherein the chemical vapor deposition reactor contains a substrate article heated to a temperature in the range of from about 300° C. to about 1000° C.

12. The method according to claim 11, wherein the pressure of the precursor vapor in the chemical vapor deposition reactor is from about 0.1 to about 760 Torr.

13. The method according to claim 1, wherein the precursor(s) comprise a mixture of β-diketonate compounds selected from the group consisting of $La(thd)_3$, $Sr(thd)_2$ and $Mn(thd)_3$.

14. The method according to claim 1, wherein the precursor(s) comprise a mixture of β-diketonate compounds selected from the group consisting of $La(thd)_3$, $Ca(thd)_2$ and $Mn(thd)_3$.

15. The method according to claim 14, wherein said precursor(s) comprise a mixture of Lewis base adducts of metal β-diketonate precursors.

16. The method according to claim 1, wherein M is Ca and said manganate material has A-site deficient stoichiometry, where (La+ Ca)<0.9.

17. The method according to claim 16, having a (La+Ca):Mn ratio that is between 0.6 and 0.9.

18. The method according to claim 16, having a Ca/La ratio that is between 0.35 and 0.55.

19. The method according to claim 1, wherein M is Sr and said manganate material has A-site deficient stoichiometry, where (La+ Sr)<0.9.

20. The method according to claim 1, wherein M is Ba and said manganate material has A-site deficient stoichiometry, where (La+ Ba)<0.9.

21. The method according to claim 1, wherein a deposited film of the manganate material that exhibits a relatively high transition temperature before annealing displays a smaller increase in the Curie temperature upon annealing than a deposited film of the manganate material that exhibits a relatively low transition temperature before annealing.

22. The method according to claim 1, wherein the manganate material has a ratio of (x+y):Mn from 0.6 to 0.9.

* * * * *